United States Patent
Wehrly, Jr.

(10) Patent No.: US 6,806,120 B2
(45) Date of Patent: Oct. 19, 2004

(54) CONTACT MEMBER STACKING SYSTEM AND METHOD

(75) Inventor: James Douglas Wehrly, Jr., Austin, TX (US)

(73) Assignee: Staktek Group, L.P., Austin, TX (US)

( * ) Notice: Subject to any disclaimer, the term of this patent is extended or adjusted under 35 U.S.C. 154(b) by 0 days.

(21) Appl. No.: 10/092,104

(22) Filed: Mar. 6, 2002

(65) Prior Publication Data

US 2002/0142515 A1 Oct. 3, 2002

Related U.S. Application Data

(62) Division of application No. 09/819,171, filed on Mar. 27, 2001, now Pat. No. 6,462,408.

(51) Int. Cl.$^7$ .......................... H01L 21/44; H01L 21/48; H01L 21/50
(52) U.S. Cl. ....................................................... 438/109
(58) Field of Search ................................ 438/107, 109, 438/119, 123

(56) References Cited

U.S. PATENT DOCUMENTS

| | | | |
|---|---|---|---|
| 3,246,386 A | 4/1966 | Ende | 29/155.5 |
| 3,287,606 A | 11/1966 | Schwartz | 317/101 |
| 3,290,559 A | 12/1966 | Kirby | 317/101 |
| 3,313,986 A | 4/1967 | Kilby | 317/101 |
| 3,377,516 A | 4/1968 | Ellett | 317/101 |

(List continued on next page.)

FOREIGN PATENT DOCUMENTS

| | | |
|---|---|---|
| EP | 122-687 A | 10/1984 |
| EP | 0 298 211 A3 | 1/1989 |
| JP | 57-31166 A | 2/1982 |
| JP | 58-112348 A | 4/1983 |
| JP | 58-96756 A | 8/1983 |

(List continued on next page.)

OTHER PUBLICATIONS

Dense–Pac Microsystems, Inc., Catalog describing two products: DPS512X16A3 Ceramic 512KX16 CMOS SRAM Module, pp. 865–870.

(List continued on next page.)

*Primary Examiner*—David A. Zarneke
(74) *Attorney, Agent, or Firm*—Andrews Kurth LLP

(57) ABSTRACT

A system and method for selectively stacking and interconnecting individual integrated circuit devices to create a high-density integrated circuit module. In a preferred embodiment, conventional thin small outline packaged (TSOP) memory circuits are vertically stacked one above the other. The constituent IC elements act in concert to provide an assembly of memory capacity approximately equal to the sum of the capacities of the ICs that constitute the assembly. The IC elements of the stack are electrically connected through individual contact members that connect corresponding leads of IC elements positioned adjacently in the stack. In a preferred embodiment, the contact members are composed of lead frame material. Methods for creating stacked integrated circuit modules are provided that provide reasonable cost, mass production techniques to produce modules. In a preferred method, a carrier frame of lead frame material is configured to present an opening into which opening project plural lead-like contact members that correspond to the leads of an IC element. The contact members contact the leads of the lower IC element of the stack while the leads of the upper IC of the assembly contact the upper surfaces of the contact members. The stack is assembled using typical surface mount equipment and, after assembly, the carrier portion of the frame is removed to leave the plurality of contact members in place between selected leads.

3 Claims, 11 Drawing Sheets

U.S. PATENT DOCUMENTS

| | | |
|---|---|---|
| 3,403,300 A | 9/1968 | Horowitz et al. ............ 317/101 |
| 3,436,604 A | 4/1969 | Hyltin et al. ................ 317/101 |
| 3,515,949 A | 6/1970 | Michaels ..................... 317/101 |
| 3,535,595 A | 10/1970 | Moore ......................... 317/101 |
| 3,614,541 A | 10/1971 | Farrand ....................... 317/101 |
| 3,614,546 A | 10/1971 | Avins .......................... 174/234 |
| 3,671,812 A | 6/1972 | Peluso et al. ................ 317/118 |
| 3,713,893 A | 1/1973 | Shirland ....................... 136/89 |
| 3,727,064 A | 4/1973 | Bottini ......................... 250/217 |
| 3,739,462 A | 6/1973 | Hasty ........................... 29/577 |
| 3,746,934 A | 7/1973 | Stein ........................... 317/101 |
| 3,925,801 A | 12/1975 | Haitz et al. ................... 357/19 |
| 3,949,274 A | 4/1976 | Anacker ...................... 317/101 |
| 3,959,579 A | 5/1976 | Johnson ...................... 174/68.5 |
| 4,017,963 A | 4/1977 | Beyerlein ..................... 29/577 |
| 4,103,318 A | 7/1978 | Schwede ...................... 361/388 |
| 4,116,518 A | 9/1978 | Pleskac ........................ 339/17 |
| 4,116,519 A | 9/1978 | Grabbe et al. ................ 339/17 |
| 4,139,726 A | 2/1979 | Penrod et al. ................ 174/52 |
| 4,158,745 A | 6/1979 | Keller .......................... 174/52 |
| 4,241,493 A | 12/1980 | Andrulitis et al. ............ 29/572 |
| 4,288,808 A | 9/1981 | Hantusch ..................... 357/68 |
| 4,288,814 A | 9/1981 | Gogal .......................... 361/414 |
| 4,321,418 A | 3/1982 | Dran et al. ................... 136/251 |
| 4,331,258 A | 5/1982 | Geschwind ................... 220/359 |
| 4,364,620 A | 12/1982 | Mulholland et al. .......... 339/17 |
| 4,371,912 A | 2/1983 | Guzik .......................... 361/417 |
| 4,379,259 A | 4/1983 | Varadi et al. ................. 324/73 |
| 4,394,712 A | 7/1983 | Anthony ...................... 361/411 |
| 4,398,235 A | 8/1983 | Lutz et al. .................... 361/393 |
| 4,406,508 A | 9/1983 | Sadigh-Behzadi ............ 339/75 |
| 4,437,235 A | 3/1984 | McIver ........................ 29/840 |
| 4,451,973 A | 6/1984 | Tateno et al. ................. 29/588 |
| 4,521,828 A | 6/1985 | Fanning ...................... 361/386 |
| 4,525,921 A | 7/1985 | Carson et al. ................ 29/577 |
| 4,571,663 A | 2/1986 | McPherson ................. 361/393 |
| 4,574,331 A | 3/1986 | Smolley ....................... 361/393 |
| 4,630,172 A | 12/1986 | Stenerson et al. ........... 361/386 |
| 4,631,573 A | 12/1986 | Sutrina ........................ 357/82 |
| 4,633,573 A | 1/1987 | Scherer ....................... 29/589 |
| 4,638,348 A | 1/1987 | Brown et al. ................. 357/74 |
| 4,638,406 A | 1/1987 | Samson ....................... 361/403 |
| 4,642,735 A | 2/1987 | Hodsdon et al. ............. 361/424 |
| 4,680,617 A | 7/1987 | Ross ............................ 357/72 |
| 4,684,975 A | 8/1987 | Takiar et al. ................. 357/70 |
| 4,688,864 A | 8/1987 | Sorel ........................... 439/74 |
| 4,696,525 A | 9/1987 | Coller et al. ................. 439/69 |
| 4,698,663 A | 10/1987 | Sugimoto et al. ............ 357/81 |
| 4,706,166 A | 11/1987 | Go ............................... 361/403 |
| 4,712,129 A | 12/1987 | Orcutt ......................... 357/84 |
| 4,722,060 A | 1/1988 | Quinn et al. ................. 364/490 |
| 4,733,461 A | 3/1988 | Nakano ....................... 29/830 |
| 4,761,681 A | 8/1988 | Reid ............................ 357/68 |
| 4,763,188 A | 8/1988 | Johnson ....................... 357/74 |
| 4,764,846 A | 8/1988 | Go ............................... 361/388 |
| 4,770,640 A | 9/1988 | Walter ......................... 439/69 |
| 4,796,078 A | 1/1989 | Phelps, Jr. et al. ........... 357/68 |
| 4,821,007 A | 4/1989 | Fields et al. ................. 333/238 |
| 4,821,148 A | 4/1989 | Kobayashi et al. ........... 361/392 |
| 4,823,234 A | 4/1989 | Konishi et al. .............. 361/386 |
| 4,829,403 A | 5/1989 | Harding ...................... 361/386 |
| 4,833,568 A | 5/1989 | Berhold ....................... 361/383 |
| 4,839,717 A | 6/1989 | Phy et al. ..................... 357/74 |
| 4,841,355 A | 6/1989 | Parks ........................... 357/82 |
| 4,855,868 A | 8/1989 | Harding ...................... 361/386 |
| 4,862,245 A | 8/1989 | Pashby et al. ................ 357/70 |
| 4,862,249 A | 8/1989 | Carlson ....................... 357/80 |
| 4,868,712 A | 9/1989 | Woodman ................... 361/388 |
| 4,878,106 A | 10/1989 | Sachs .......................... 357/72 |
| 4,884,237 A | 11/1989 | Mueller et al. .............. 365/63 |
| 4,891,789 A | 1/1990 | Quattrini et al. ............. 365/63 |
| 4,924,352 A | 5/1990 | Septfons ...................... 361/388 |
| 4,948,645 A | 8/1990 | Holzinger et al. ............ 428/40 |
| 4,953,005 A | 8/1990 | Carlson et al. ............... 357/80 |
| 4,953,060 A | 8/1990 | Lauffer et al. ............... 361/388 |
| 4,956,694 A | 9/1990 | Eide ............................ 357/74 |
| 4,983,533 A | 1/1991 | Go ............................... 437/7 |
| 4,994,411 A | 2/1991 | Naito et al. .................. 437/209 |
| 4,996,583 A | 2/1991 | Hatada ......................... 357/70 |
| 4,996,587 A | 2/1991 | Hinrichsmeyer et al. ..... 357/74 |
| 4,997,517 A | 3/1991 | Parthasarathi ............... 156/630 |
| 5,001,545 A | 3/1991 | Kalfus et al. ................. 357/70 |
| 5,012,323 A | 4/1991 | Farwnworth ................ 357/75 |
| 5,014,113 A | 5/1991 | Casto ........................... 357/70 |
| 5,016,138 A | 5/1991 | Woodman ................... 361/381 |
| 5,025,307 A | 6/1991 | Ueda et al. ................... 357/80 |
| 5,031,072 A | 7/1991 | Malhi et al. .................. 361/387 |
| 5,034,350 A | 7/1991 | Marchisi ...................... 437/207 |
| 5,041,015 A | 8/1991 | Travis ......................... 439/492 |
| 5,041,395 A | 8/1991 | Steffen ........................ 437/206 |
| 5,043,794 A | 8/1991 | Tai et al. ...................... 357/74 |
| 5,049,527 A | 9/1991 | Merrick et al. ............. 437/220 |
| 5,057,903 A | 10/1991 | Olla ............................. 357/72 |
| 5,057,906 A | 10/1991 | Ishigami ...................... 357/80 |
| 5,058,265 A | 10/1991 | Goldfarb ...................... 29/852 |
| 5,065,277 A | 11/1991 | Davidson .................... 361/383 |
| 5,068,708 A | 11/1991 | Newman ...................... 357/68 |
| 5,086,018 A | 2/1992 | Conru et al. ................. 437/207 |
| 5,099,393 A | 3/1992 | Bentlage et al. ............. 361/413 |
| 5,101,324 A | 3/1992 | Sato ............................. 361/400 |
| 5,104,820 A | 4/1992 | Go et al. ...................... 437/51 |
| 5,107,328 A | 4/1992 | Kinsman ...................... 357/74 |
| 5,108,553 A | 4/1992 | Foster et al. ................. 205/125 |
| 5,128,831 A | 7/1992 | Fox, III et al. .............. 361/396 |
| 5,138,430 A | 8/1992 | Gow, 3rd et al. ............. 357/70 |
| 5,138,434 A | 8/1992 | Wood et al. .................. 357/74 |
| 5,140,745 A | 8/1992 | McKenzie, Jr. ............. 29/852 |
| 5,147,815 A * | 9/1992 | Casto ........................... 29/827 |
| 5,151,559 A | 9/1992 | Conru et al. ................. 174/52.4 |
| 5,155,068 A | 10/1992 | Tada ........................... 438/125 |
| 5,159,434 A | 10/1992 | Kohno et al. ................ 358/80 |
| 5,168,926 A | 12/1992 | Watson et al. ............... 165/185 |
| 5,198,888 A | 3/1993 | Sugano et al. ............... 257/686 |
| 5,200,362 A | 4/1993 | Lin et al. ..................... 437/207 |
| 5,214,307 A | 5/1993 | Davis .......................... 257/676 |
| 5,214,845 A | 6/1993 | King et al. ................... 29/841 |
| 5,221,642 A | 6/1993 | Burns .......................... 437/207 |
| 5,222,014 A | 6/1993 | Lin .............................. 361/414 |
| 5,223,739 A | 6/1993 | Katsumata et al. .......... 257/676 |
| 5,231,304 A | 7/1993 | Solomon ...................... 257/684 |
| 5,236,117 A | 8/1993 | Roane et al. ............. 228/180.21 |
| 5,239,447 A | 8/1993 | Cotues et al. ................ 361/744 |
| 5,241,454 A | 8/1993 | Ameen et al. ............... 361/744 |
| 5,243,133 A | 9/1993 | Engle et al. ................. 174/52.4 |
| 5,247,423 A | 9/1993 | Lin et al. ..................... 361/719 |
| 5,262,927 A | 11/1993 | Chia et al. ................... 361/784 |
| 5,266,834 A | 11/1993 | Nishi et al. .................. 257/706 |
| 5,273,940 A | 12/1993 | Sanders ....................... 437/209 |
| 5,279,029 A | 1/1994 | Burns .......................... 29/856 |
| 5,279,991 A | 1/1994 | Minahan et al. ............. 437/208 |
| 5,281,852 A | 1/1994 | Normington ................ 257/685 |
| 5,307,929 A | 5/1994 | Seidler ........................ 206/331 |
| 5,311,060 A | 5/1994 | Rostoker et al. ............ 257/796 |
| 5,311,401 A | 5/1994 | Gates, Jr. et al. ........... 361/760 |
| 5,313,096 A | 5/1994 | Eide ............................ 257/686 |
| 5,313,097 A | 5/1994 | Haj-Ali-Ahmadi et al. . 257/706 |
| 5,343,075 A | 8/1994 | Nishino ....................... 257/686 |
| 5,343,366 A | 8/1994 | Cipolla et al. ............... 361/785 |
| 5,347,428 A | 9/1994 | Carson et al. ............... 361/760 |
| 5,347,429 A | 9/1994 | Kohno et al. ................ 361/813 |
| 5,367,766 A | 11/1994 | Burns et al. .................. 29/848 |

| | | | |
|---|---|---|---|
| 5,369,056 A | 11/1994 | Burns et al. | 437/209 |
| 5,369,058 A | 11/1994 | Burns et al. | 437/209 |
| 5,371,866 A | 12/1994 | Cady | 395/400 |
| 5,373,189 A | 12/1994 | Massit et al. | 257/686 |
| 5,377,077 A | 12/1994 | Burns | 361/704 |
| 5,384,689 A | 1/1995 | Shen | 361/761 |
| 5,394,010 A | 2/1995 | Tazawa et al. | 257/686 |
| 5,397,916 A | 3/1995 | Normington | 257/686 |
| 5,420,751 A | 5/1995 | Burns | 361/707 |
| 5,426,566 A | 6/1995 | Beilstein, Jr. et al. | 361/735 |
| 5,446,313 A | 8/1995 | Masuda et al. | 257/666 |
| 5,446,620 A | 8/1995 | Burns | 361/704 |
| 5,475,920 A | 12/1995 | Burns et al. | 29/856 |
| 5,479,318 A | 12/1995 | Burns | 361/735 |
| 5,481,133 A | 1/1996 | Hsu | 257/621 |
| 5,484,959 A | 1/1996 | Burns | 174/524 |
| 5,493,476 A | 2/1996 | Burns | 361/735 |
| 5,499,160 A | 3/1996 | Burns | 361/704 |
| 5,514,907 A | 5/1996 | Moshayedi | 257/686 |
| 5,523,619 A | 6/1996 | McAllister et al. | 257/686 |
| 5,543,664 A | 8/1996 | Burns | 257/787 |
| 5,550,711 A | 8/1996 | Burns et al. | 361/728 |
| 5,552,963 A | 9/1996 | Burns | 361/735 |
| 5,561,591 A | 10/1996 | Burns | 361/704 |
| 5,566,051 A | 10/1996 | Burns | 361/704 |
| 5,586,009 A | 12/1996 | Burns | 361/735 |
| 5,587,341 A * | 12/1996 | Masayuki et al. | 438/109 |
| 5,588,205 A | 12/1996 | Roane | 29/830 |
| 5,592,364 A | 1/1997 | Roane | 361/735 |
| 5,605,592 A | 2/1997 | Burns | 156/182 |
| 5,612,570 A | 3/1997 | Eide et al. | 257/686 |
| 5,615,475 A | 4/1997 | Burns | 29/827 |
| 5,631,193 A | 5/1997 | Burns | 29/827 |
| 5,644,161 A | 7/1997 | Burns | 257/668 |
| 5,654,877 A | 8/1997 | Burns | 361/713 |
| 5,657,537 A | 8/1997 | Saia et al. | 29/830 |
| 5,723,903 A | 3/1998 | Masuda et al. | 257/696 |
| 5,778,522 A | 7/1998 | Burns | 29/830 |
| 5,783,464 A | 7/1998 | Burns | 438/112 |
| 5,801,437 A | 9/1998 | Burns | 257/685 |
| 5,804,870 A | 9/1998 | Burns | 257/666 |
| 5,828,125 A | 10/1998 | Burns | 257/668 |
| 5,835,988 A | 11/1998 | Ishii | 257/684 |
| 5,843,807 A | 12/1998 | Burns | 438/109 |
| 5,864,175 A | 1/1999 | Burns | 257/684 |
| 5,894,984 A * | 4/1999 | Sakai et al. | 228/180.22 |
| 5,895,232 A | 4/1999 | Burns | 438/107 |
| 5,960,539 A | 10/1999 | Burns | 29/854 |
| 5,978,227 A | 11/1999 | Burns | 361/735 |
| 6,025,642 A | 2/2000 | Burns | 257/686 |
| 6,028,352 A | 2/2000 | Eide | 257/686 |
| 6,049,123 A | 4/2000 | Burns | 257/686 |
| RE36,916 E | 10/2000 | Moshayedi | 257/723 |
| 6,133,637 A * | 10/2000 | Hikita et al. | 257/777 |
| 6,168,970 B1 | 1/2001 | Burns | 438/106 |
| 6,194,247 B1 | 2/2001 | Burns | 438/107 |
| 6,205,654 B1 | 3/2001 | Burns | 29/830 |
| 6,288,907 B1 | 9/2001 | Burns | 361/783 |
| 6,310,392 B1 | 10/2001 | Burns | 257/723 |
| 6,388,336 B1 * | 5/2002 | Venkateshwaran et al. | 257/779 |

FOREIGN PATENT DOCUMENTS

| | | | | |
|---|---|---|---|---|
| JP | 58-219757 A | 12/1983 | | |
| JP | 59154033 A * | 9/1984 | | H01L/21/56 |
| JP | 60-160641 | 8/1985 | | |
| JP | 60-254762 A | 12/1985 | | |
| JP | 61-63048 | 4/1986 | | |
| JP | 61-75558 A | 4/1986 | | |
| JP | 61-163652 A | 7/1986 | | |
| JP | 61-219143 A | 9/1986 | | |
| JP | 62-230027 A | 8/1987 | | |
| JP | 63-117451 A | 5/1988 | | |
| JP | 63-153849 A | 6/1988 | | |
| JP | 2-260448 | 10/1990 | | |
| JP | 3-96266 | 4/1991 | | |
| JP | 3-167868 A | 7/1991 | | |
| JP | 4-209562 | 7/1992 | | |
| JP | 6-77644 | 8/1992 | | |
| SU | 834-957 | 5/1981 | | |

OTHER PUBLICATIONS

Dense–Pac Microsystems, Inc., "Memory Products–Short-Form–Q4," 1994, 5 pages.

Dense–Pac Microsystems, Inc., "Short Order Catalog," 1990, 12 pages.

Dense–Pac Microsystems, Inc., "Short Form Catalog," 1991, 20 pages.

Dense–Pac Microsystems, Inc., "3–D Technology," 1993, 15 pages.

Dense–Pac Microsystems, Inc., 16–Megabit High Speed CMOS SRAM.

Dense–Pac Microsystems, Inc., 128–Megabyte SDRAM Sodimm.

Dense–Pac Microsystems, Inc., 256–Megabyte CMOS DRAM.

Dense–Pac Microsystems, Inc. flyer/"While others are still defining it . . . Our customers are cashing in!".

Tuckerman, D.B. et al., "Laminated Memory: A New 3–Dimensional Packaging Technology for MCMs" article, nCHIP, Inc., IEEE, 1994.

1992 Proceedings, 42$^{nd}$ Electronic Components & Technology Conference, May 18–20, 1992.

Research Disclosure, Organic Card Device Carrier, 31318. May 1990, No. 313.

"Introducing a Revolutionary 3 Dimensional Package Type—The SLCC," John Forthun, Advancement in Technology, Feb. 26, 1992, 12 pages.

"New levels of hybrid IC density are provided by Three–Dimensional Packaging" article, 2 pages.

3–D Integrated Packaging and Interconnect Technology; Wescon/90 Conference Record, held Nov. 13–15, 1990, Anahein, CA.

"Alternative Assembly for Memory Ics," XP–002093051, Electronic Engineering, Jan. 1987, p. 22.

Christian VAL and Thierry Lenoin, 3d Interconnection for Ultra–Dense Multichip Modules, IEEE, pp. 540–547.

Dean Frew, High Density Memory Packaging Technology High Speed Imaging Applications, SPIE, vol. 1346 Ultra–high–and High–Speed Photography, Videography, Photonics, and Velocimetry '90, pp. 200–209.

Iinternational Electron Device Meeting, IEDM Technical Digest, Washington, D.C., Dec. 6–9, 1987.

Patent Abstract of Japan, Publication No. 05029534, Published May 2, 1993, Inventor: Nakamura Shigemi, entitled "Memory Module", European Patent Office.

Alvin Weinburg and W. Kinzy Jones, "Vertically–Integrated Package," IEEE, pp. 436–443.

IBM Technical Disclosure Bulletin, vol. 20 No. 11A Apr. 1978.

IBM Technical Disclosure Bulletin, vol. 23 No. 12 May 1981.

IBM Technical Disclosure Bulletin, vol. 30, No. 8, Jan. 8, 1988, pp. 373–374.

IBM Technical Disclosure Bulletin, vol. 32 No. 3B Aug. 1989.

"Declaration of Mark Moshayedi in Support of Plaintiff/CounterDefendant's Motion for Summary Judgment of Non–Infringement of U.S. patent No. 4,956,694," Civil Action No. SACV– 98–822, *Simple Technology, Inc. v. Dense–Pac Microsystems, Inc.*, 20 total pages (9 pages of the Declaration and 11 pages of attachments to Declaration).

* cited by examiner

CONTACT MEMBER STACKING SYSTEM AND METHOD

CROSS-REFERENCE TO RELATED APPLICATIONS

This application is a divisional of U.S. patent application Ser. No. 09/819,171, filed Mar. 27, 2001, now U.S. Pat. No. 6,462,408, which application is incorporated herein by reference for all purposes.

TECHNICAL FIELD

The present invention relates to aggregating integrated circuits and, in particular, to stacking integrated circuits.

BACKGROUND OF THE INVENTION

A variety of techniques are used to stack integrated circuits. Some require that the circuits be encapsulated in special packages, while others use circuits in conventional packages. In some cases, the leads alone of packaged circuits have been used to create the stack and interconnect its constituent elements. In other techniques, structural elements such as rails are used to create the stack and interconnect the constituent elements.

Circuit boards in vertical orientations have been used to provide interconnection between stack elements. For example, in U.S. Pat. No. Re. 36,916 to Moshayedi, a technique is described for creating a multi-chip module from surface-mount packaged memory chips that purportedly uses sideboards to mount the assembly to the main or motherboard. The devices are interconnected on their lead-emergent sides through printed circuit boards (PCBs) oriented vertically to a carrier or motherboard that is contacted by connective sites along the bottom edge of the PCBs. Other systems purport to use sideboard structures such as Japanese Patent Laid-open Publication No. Hei 6-77644 which discloses vertical PCBs used as side boards to interconnect packaged circuit members of the stack.

Others have stacked integrated circuits without casings or carrier plates. Electrical conductors are provided at the edges of the semiconductor bodies and extended perpendicularly to the planes of the circuit bodies. Such a system is shown in U.S. Pat. No. 3,746,934 to Stein.

Still others have stacked packaged circuits using interconnection packages similar to the packages within which the integrated circuits of the stack are contained to route functionally similar terminal leads in non-corresponding lead positions. An example is found in U.S. Pat. No. 4,398,235 to Lutz et al. Simple piggyback stacking of DIPs has been shown in U.S. Pat. No. 4,521,828 to Fanning.

Some more recent methods have employed rail-like structures used to provide interconnection and structural integrity to the aggregated stack. The rails are either discrete elements that are added to the structure or are crafted from specific orientations of the leads of the constituent circuit packages. For example, in U.S. Pat. No. 5,266,834 to Nishi et al., one depicted embodiment illustrates a stack created by selective orientation of the leads of particularly configured stack elements, while in U.S. Pat. No. 5,343,075 to Nishino, a stack of semiconductor devices is created with contact plates having connective lines on inner surfaces to connect the elements of the stack.

More sophisticated techniques have been recently developed for stacking integrated circuits. The assignee of the present invention has developed a variety of such techniques for stacking integrated circuits. In one such method, multiple conventional ICs are stacked and external leads are interconnected with one another by means of a rail assembly. The rails are made of flat strips of metal and the rails define apertures that receive the leads of the discrete IC packages. An example of this system is shown in U.S. Pat. No. 5,778,522 assigned to the assignee of the present invention.

An even more recent technique developed by the assignee of the present invention interconnects conventionally packaged ICs with flexible circuits disposed between stack elements. The flexible circuits include an array of flexible conductors supported by insulating sheets. Terminal portions of the flexible conductors are bent and positioned to interconnect appropriate leads of respective upper and lower IC packages.

Some of the previously described systems have required encapsulation of the constituent ICs in special packages. Still others have added rails that must be custom-fabricated for the application. Many have relied upon connections that substantially coincide with the vertical orientation of the stack and thus require more materials. Many techniques add excessive height to the stack. Others that use PCBs have inhibited heat dissipation of the stack. Most have deficiencies that add expense or complexity or thermal inefficiency to stacked integrated circuits. What is needed, therefore, is a technique and system for stacking integrated circuits that provides a thermally efficient, robust structure while not adding excessive height to the stack yet allowing production at reasonable cost with easily understood and managed materials and methods.

SUMMARY OF THE INVENTION

The present invention provides a system and method for selectively stacking and interconnecting individual integrated circuit devices to create a high-density integrated circuit module. It is principally designed for use with memory circuits, but can be employed to advantage with any type of packaged and leaded integrated circuit where area conservation and use of duplicative circuitry are present considerations.

In a preferred embodiment, conventional thin small outline packaged (TSOP) memory circuits are vertically stacked one above the other. The stack consists of two packaged integrated circuits (ICs), but alternatives may employ greater numbers of ICs. In a stacked module created in accordance with the present invention, the constituent IC elements act in concert to provide an assembly of memory capacity approximately equal to the sum of the capacities of the ICs that constitute the assembly. The IC elements of the stack are electrically connected through individual contact members that connect corresponding leads of IC elements positioned adjacently in the stack. In a preferred embodiment, the contact members are composed of lead frame material. In a preferred embodiment, two TSOP memory circuits are differentially enabled by extension of a conductive runner from one contact member positioned at the no-connect (N/C) lead of the lower TSOP to another contact member connected to chip-enable lead of the upper TSOP.

Methods for creating stacked integrated circuit modules are provided that provide reasonable cost, mass production techniques to produce modules. In a preferred method, a carrier frame of lead frame material is configured to present an opening into which opening project plural lead-like contact members that correspond to the leads of an IC element. The contact members contact the leads of the lower IC element of the stack while the leads of the upper IC of the assembly contact the upper surfaces of the contact members. The stack is assembled using typical surface mount equipment and, after assembly, the carrier portion of the frame is removed to leave the plurality of contact members in place between selected leads.

DETAILED DESCRIPTION OF EMBODIMENTS

Figure 1:
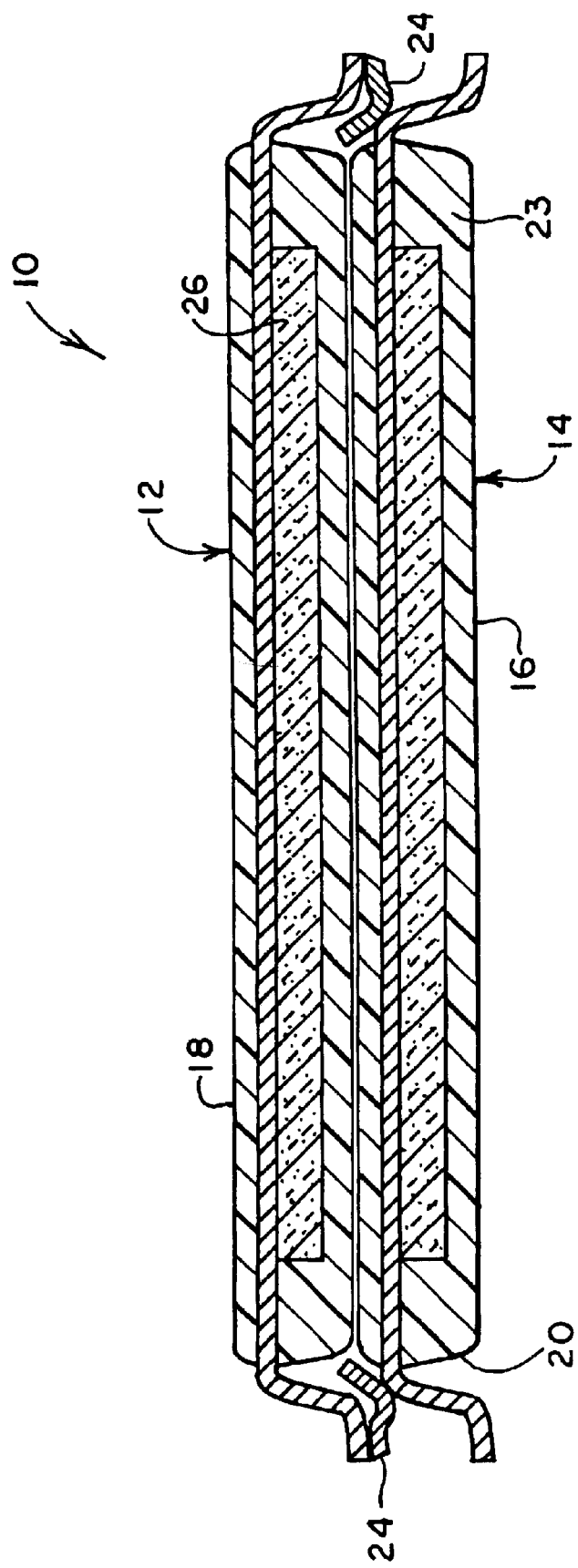
FIG. 1 is a cross-sectional view of a circuit module devised in accordance with the present invention.

FIG. 1 depicts a high-density memory module 10 devised in accordance with the present invention. The present invention is adaptable to a variety of IC circuits and, in its preferred implementation, memory circuits of a variety of capacities. Module 10 is created with upper IC 12 and lower IC 14. Each of ICs 12 and 14 are, in the depicted preferred embodiment, plastic encapsulated memory circuits disposed in thin small outline packages known as TSOPs. Other package types may be used with the present invention as well as packaged circuits other than memories, but, as described here as preferred examples, the invention is advantageously implemented with memories in TSOP packaging. Each IC has a lower surface 16, upper surface 18 and periphery 20. Each of ICs 12 and 14 include an integrated circuit 26 encapsulated by a plastic body 23. As shown, contact members 24 provide connection between corresponding leads on ICs 12 and 14.

In this embodiment, due to the configuration of contact members 24, the bodies 23 of IC 12 and IC 14 are in direct contact with top surface 18 of lower IC 14 in direct contact with lower surface 16 of upper IC 12. In alternative embodiments, a thermal media or adhesive may be employed to encourage heat transference between ICs 12 and 14 in the thermal path to a mounting board.

Figure 2:
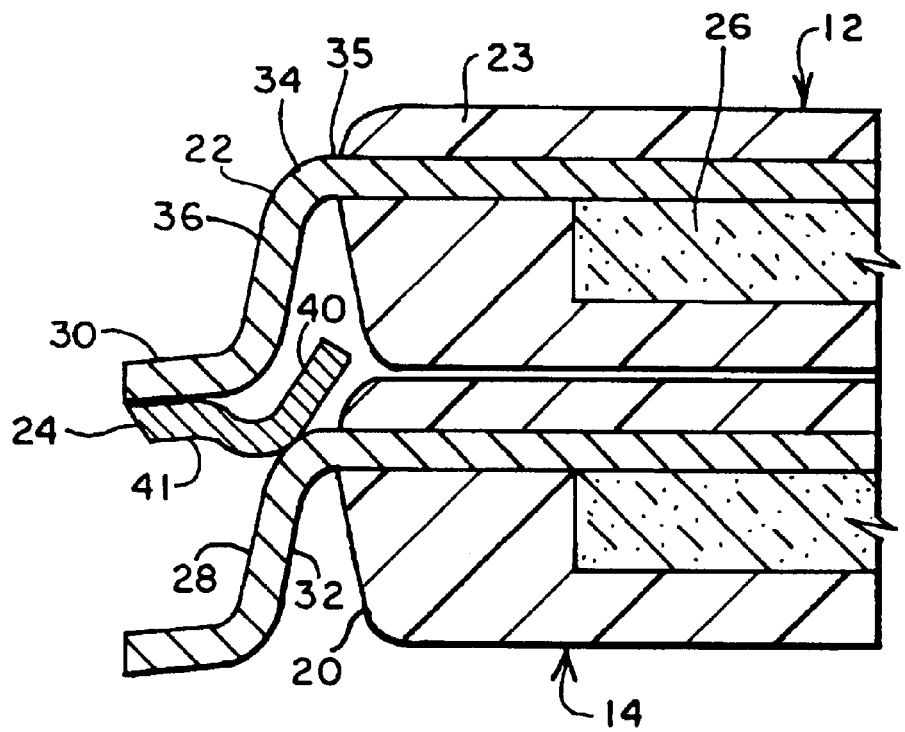
FIG. 2 is a cross-sectional view of a connection between two integrated circuits in the embodiment depicted in FIG. 1.

As depicted in FIG. 2, emergent from package peripheral wall 20, leads such as illustrated lead 22, provide a connective pathway for the electronics of the circuitry chip 26 embedded within plastic casing 23 of exemplar IC 12. Lead 22 of upper IC 12 is shown as having foot 30, shoulder 34 and a transit section 36. Shoulder 34 can extend from and include the planar part of lead 22 emergent from peripheral wall 20 (i.e., the "head" of the shoulder identified by reference 35) to the end of the curvature into transit section 36. Lead 22 of lower IC 14 is referenced to illustrate the outer surface 28 and inner surface 32 present in leads 22 of both upper IC 12 and lower IC 14. Outer surface 28 and inner surface 32 extend along the topological features of foot, transit section and shoulder and head identified with respect to lead 22 of upper IC 12 and it will be understood by those of skill in the art that the two surfaces, inner and outer, are exhibited by leads of TSOPs and other leaded packaged integrated circuits. These features of leads 22 are present in conventional TSOP packaged memory circuits available from most major suppliers of memories such as Samsung and Micron Technology, for example. Foot 30 is provided to allow the mounting of the TSOP on the surface of a printed circuit or other carrier or signal transit board. Shoulder 34 arises from providing foot 30 for surface mount connection of the IC, while transit section 36 of lead 22 connects shoulder 34 with foot 30. In practice, lead 22 and, in particular, transit section 36 are surfaces from which heat from internal chip 26 is dissipated by local air convection. Transit section 36 is often a substantially straight path but may exhibit curvature.

The present invention interposes contact members such as exemplar contact member 24 shown in FIG. 2 between selected leads of module 10. In a preferred embodiment, a contact member is disposed between each pair of corresponding leads in the assembly. In a preferred embodiment, contact member 24 is comprised of lead frame material. A material known in the art as alloy 42 is one preferred material for contact members 24. It should be recognized, however, that other conductive materials may be used for contact members 24.

Figure 3:
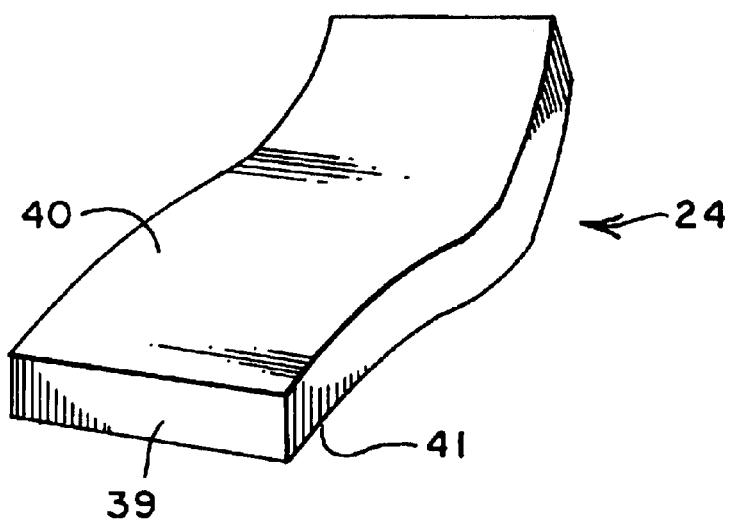
FIG. 3 depicts a contact member according to a preferred embodiment of the present invention.

In a preferred embodiment, because contact member 24 is derived from a frame carrier, the configuration of a contact member 24 exhibits an approximately rectangular cross-section as shown at reference 39 in FIG. 3 and has first and second major surfaces identified by reference numerals 40 and 41, respectively. In a preferred embodiment of module 10, first major surface 40 of contact member 24 is disposed to contact inner surface 32 of lead 22 of upper IC 12 and second major surface 41 of contact member 24 is disposed to contact outer surface 28 of lead 22 of lower IC 14. This contact between contact member 24 and leads 22 is realized, in a preferred embodiment, with solder at the contact therebetween. In this depicted embodiment, illustrated contact member 24 contacts foot 30 of example lead 22 of upper IC 12 and shoulder 34 of example lead 22 of lower IC 14. In a preferred embodiment, contact member 24 is configured to fit beneath lead 22 of upper IC 12 and above lead 22 of lower IC 14. While being in contact with the leads, it should be understood that the contact members 24 (as well as later described modified contact members 25 and 27) may have an extent greater or lesser as well as coincident with the feet of the leads of ICs 12 and 14.

In a basic preferred embodiment, contact member 24 does not lift lower surface 16 of upper IC 12 from upper surface 18 of lower IC 14 when positioned to contact the inner surface 32 of lead 22 of upper IC 12 and outer surface 28 of lead 22 of lower IC 14. There are alternative embodiments of the present invention that employ thermally conductive media adhesives or layers between ICs 12 and 14, but the consequent distancing between lower surface 16 of upper IC 12 from upper surface 18 of lower IC 14 is a function of that interposed layer.

Figure 4:
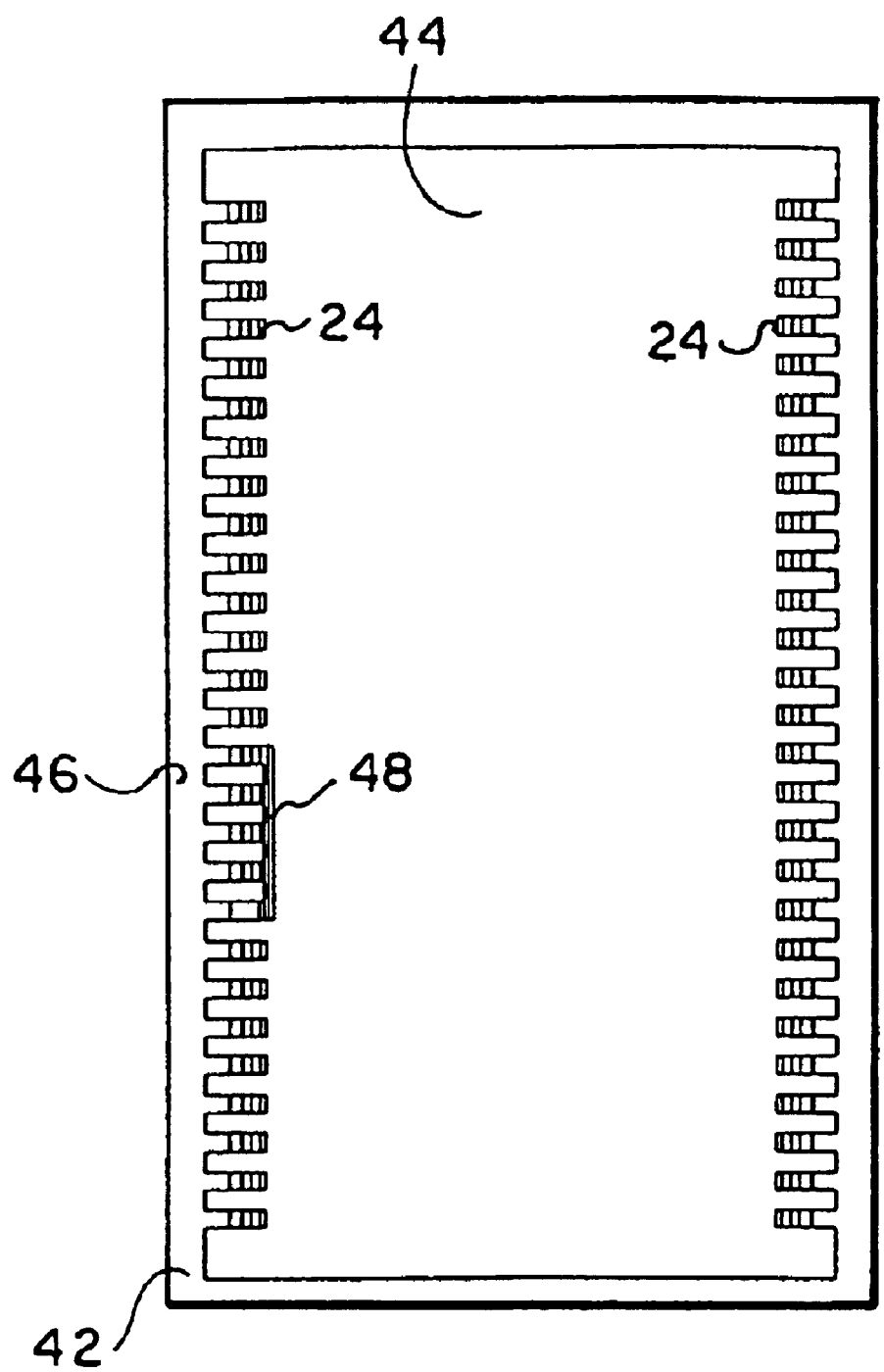
FIG. 4 is an upper plan view of the carrier frame of a preferred embodiment of the present invention.

FIG. 4 depicts a carrier frame 42 employed in a preferred embodiment of the present invention to construct module 10. As shown in FIG. 4, carrier frame 42 has a window 44 into which extend from body 46 of carrier frame 42, a plurality of contact members 24. In a preferred embodiment, carrier frame 42 is photo-etched or created with progressive die forming. If photo-etched, frame 42 will be further processed through a forming die. Use of known material such as alloy 42 for carrier frame 42 allows coefficients of thermal expansion to be matched with the ICs employed in the module.

In a two-IC module, IC 12 is positioned to make contact with the first major surfaces 40 of contact members 24 with the inner surfaces 32 of the feet 30 of its leads 22. Carrier frame 42 is set upon lower IC 14 to realize contact between the outer surfaces 28 of leads 22 of lower IC 14 and the second major surfaces 41 of contact members 24. As those of skill will recognize, pick & place and other similar tools provide well known techniques for implementing the assembly step in the method of the present invention. The connections are solder realized through any of several well-known methods including solder flux and reflow oven for example. After assembly, the contact members are cut-away from carrier frame 42 to free the assembled module 10. The body portion 46 of the frame 42 is removed after assembly by cutting, punching, milling, laser trimming or any of the techniques well understood in the art. Carrier frame 42 may provide dimples or other similar features for simplified removal of the module.

Conductive runner 48 extends, in a preferred embodiment, from a modified contact member that corresponds to a no-connect lead of the constituent ICs of the module to a modified contact member that corresponds in position to the chip-enable lead of the upper ICs of module 10. Such conductive runners can be used for isolation or selective enablement on either side of the module where appropriate.

In a preferred embodiment that employs standard TSOPs as the constituent ICs of the module, conductive runner 48 extends from N/C lead number 15 to chip-enable (CE) lead number 19. To provide the selective enablement of the constituent ICs, conductive runner 48 can contact the N/C lead of either the lower IC or both ICs, but contacts only the CE lead of upper IC 12. Consequently, the signal to enable upper IC 12 of module 10 can be applied to the N/C lead of lower IC 14 and conveyed by conductive runner 48 to the CE lead of upper IC 12. Other similar enablement schemes can be effectuated with conductive runner 48 positioned to provide differential enablement corresponding to the topology and internals of the ICs that make up module 10.

Figure 5:
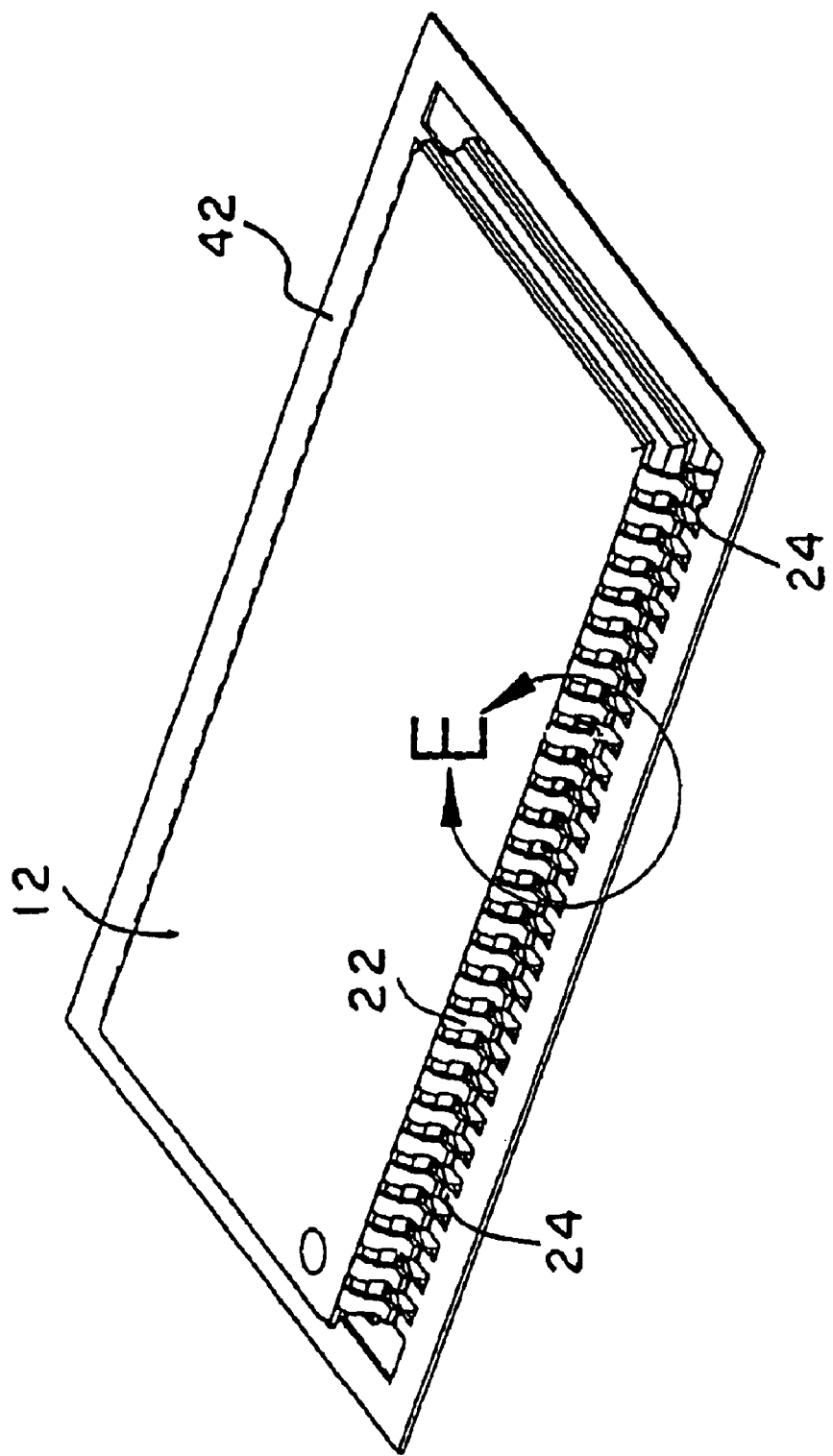
FIG. 5 is a perspective view of a stacked module under construction according to a preferred method of the present invention.

FIG. 5 is a perspective view of a stacked module under construction according to a preferred method of the present invention. Carrier frame 42 is shown having multiple contact members 24 extending into window 44. Lower IC 14 is positioned to allow contact members 24 to contact the outer surfaces 28 of leads 22, while upper IC 12 is set down on carrier frame 42 to allow contact members 24 to contact inner surfaces 32 of leads 22.

Figure 6:
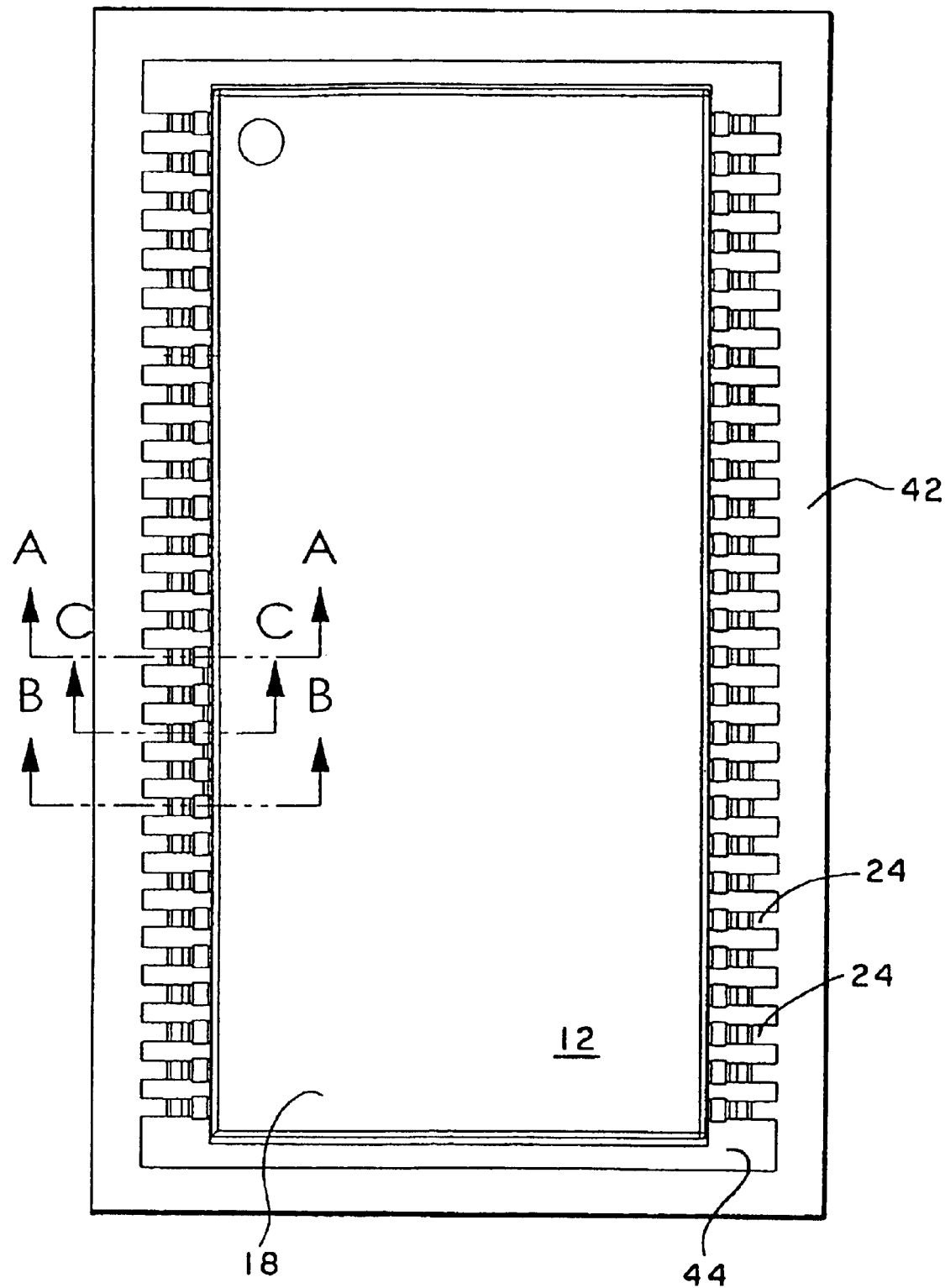
FIG. 6 is an upper plan view of a stacked module under construction according to a preferred embodiment of the present invention.

FIG. 6 is an upper plan view of a stacked module under construction according to a preferred embodiment of the present invention. FIG. 6 depicts upper IC 12 placed upon the array of contact members 24 that extend into window 44 from carrier frame 42.

Figure 7:
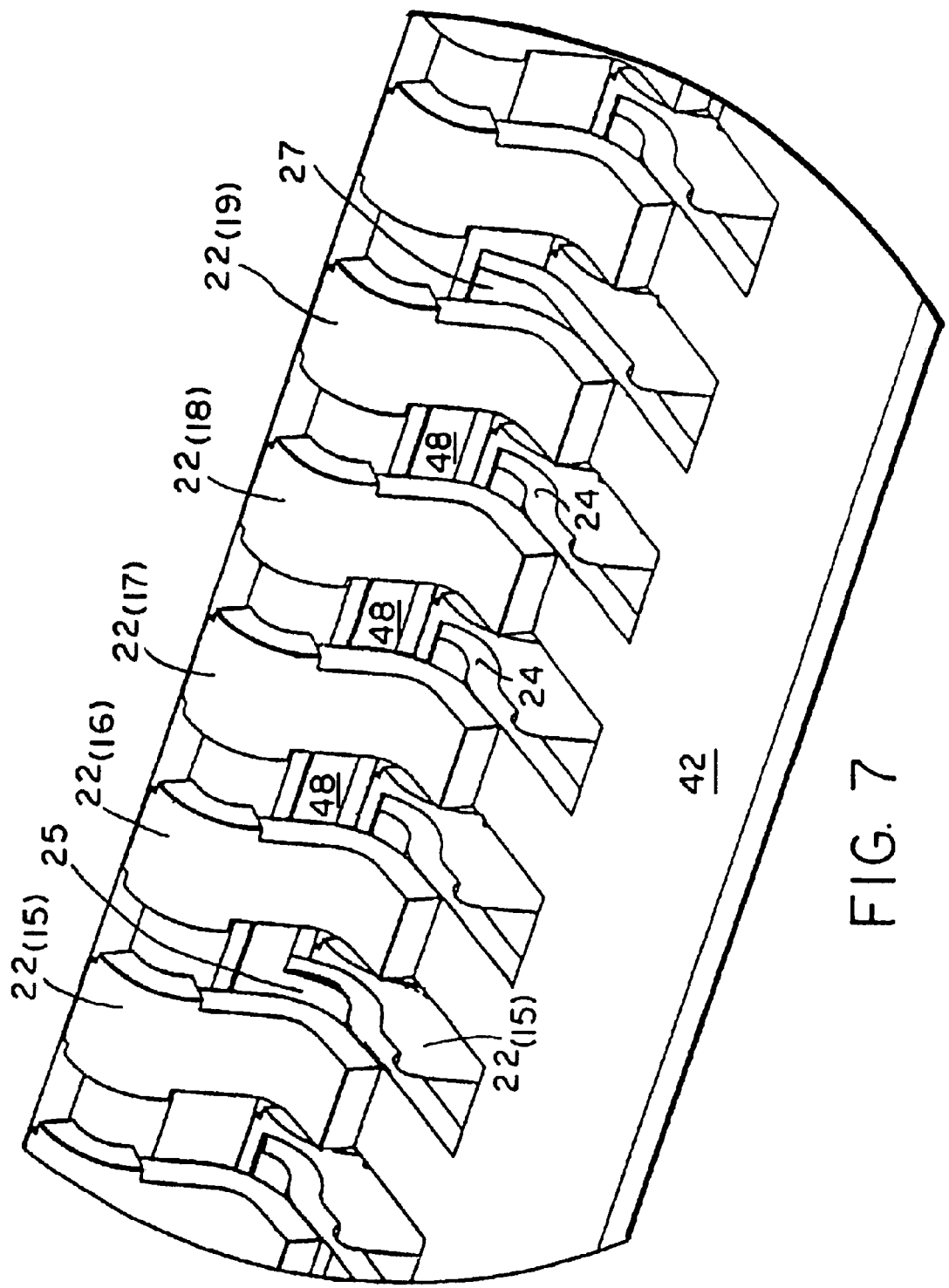
FIG. 7 shows an enlarged detail from FIG. 5.

FIG. 7 shows an enlarged detail depicting an area that illustrates the conductive runner 48. Depicted lead $22_{(15)}$ is the lead of upper IC 12 at position 15 along line A—A of FIG. 6. Lead $22_{(15)}$ is a N/C lead as is the corresponding lead $22_{(15)}$ of lower IC 14 shown positioned below modified contact member 25 that merges into conductive runner 48 shown extending behind leads $22_{(16)}$, $22_{(17)}$, $22_{(18)}$, and $22_{(19)}$ to merge with modified contact member 27. Depicted lead $22_{(19)}$ is the lead of upper IC 12 at position 19 along line B—B of FIG. 6 and is, in a preferred embodiment, the chip-enable lead for upper IC 12. As shown in further detail in later FIG. 10, modified contact member 27 does not contact the corresponding lead $22_{(19)}$ of lower IC 14. Consequently, a chip-enable signal intended to enable upper IC 12, may be applied to lead $22_{(15)}$ of lower IC 14 through that lead's contact with a main or motherboard. That enable signal may then be conveyed through conductive runner 48 to lead $22_{(19)}$ of upper IC 12.

Figure 8:
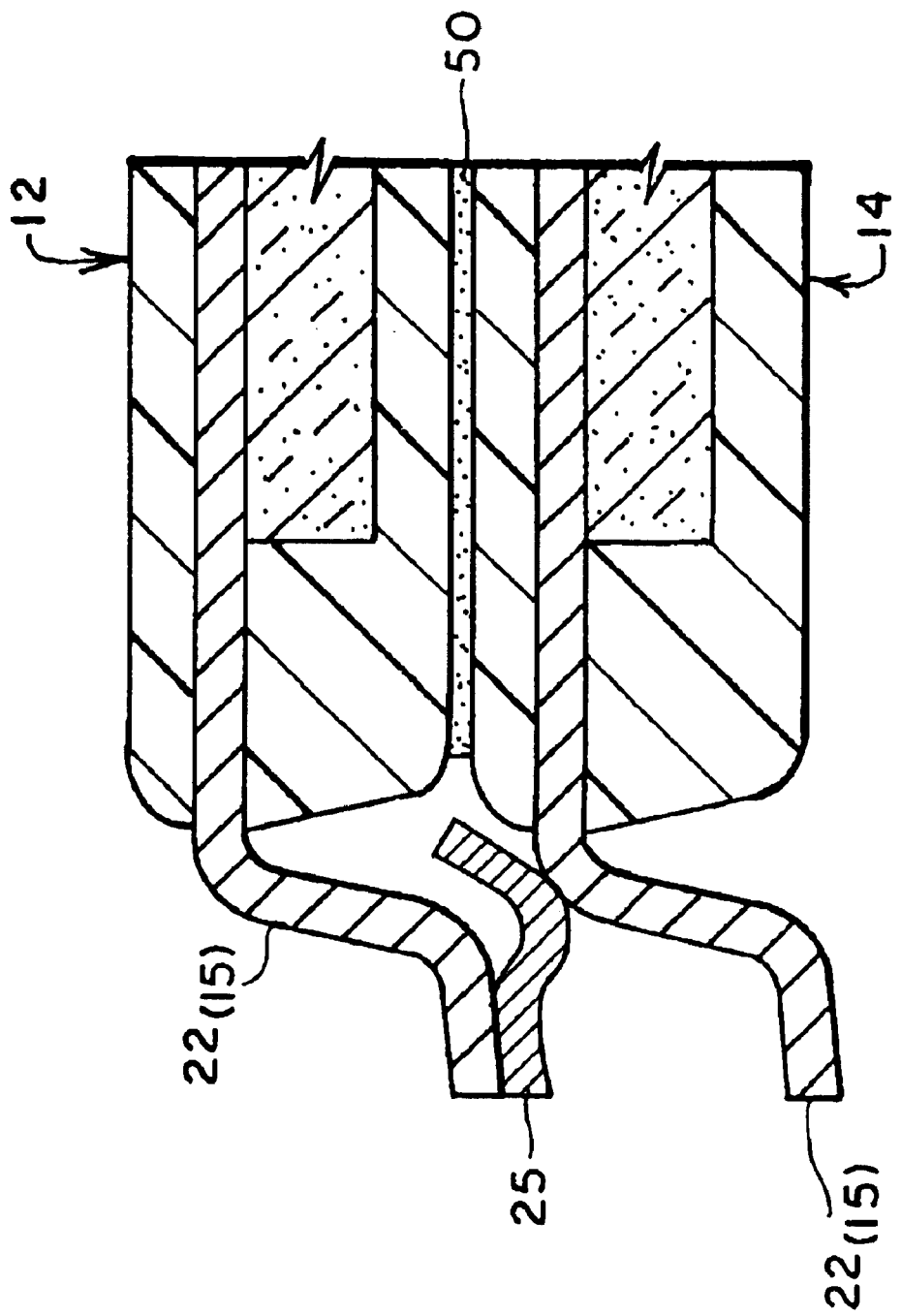
FIG. 8 depicts a sectional view of the contact member and conductive structure along line A—A of FIG. 6.

FIG. 8 depicts a sectional view of the contact member and conductive structure along line A—A of FIG. 6. FIG. 8 illustrates the contact member and lead relationship at lead $22_{(15)}$ shown earlier in FIG. 7. As shown in FIG. 8, modified contact member 25 contacts corresponding leads $22_{(15)}$ of upper and lower ICs 12 and 14, respectively. It should be understood that conductive runner 48 merges into modified contact member 25 to convey a chip enable signal supplied to lead $22_{(15)}$ of lower IC 14 to chip enable lead $22_{(19)}$ of upper IC 12. This is a preferred embodiment view, but those of skill in the art will recognize that modified contact member 25 may, in alternative embodiments, contact just lead $22_{(15)}$ of lower IC 14. Modified contact member 25 need merely be in position to acquire a chip-enable signal supplied to a N/C lead of lower IC 14. Conventionally, module 10 is mounted to a main board through mounting the feet of the leads of the lower IC of module 10. As shown in FIG. 8, upper IC 12 and lower IC 14 can be separated by a thermal material 50 which, in a preferred embodiment, may be a thermally conductive adhesive although other thermally conductive materials may occupy this position.

Figure 9:
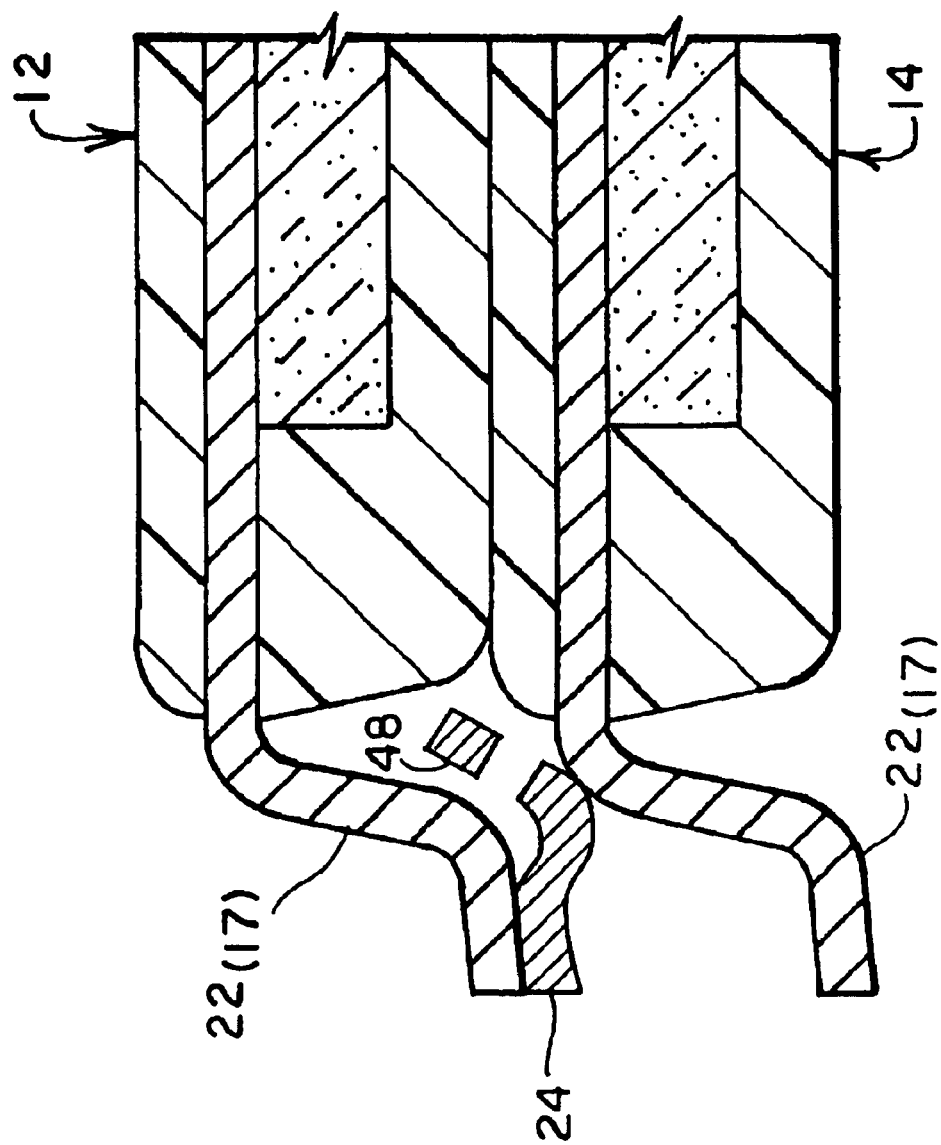
FIG. 9 depicts a sectional view of the contact member and conductive runner structure along line C—C of FIG. 6.

FIG. 9 depicts a sectional view of the contact member and conductive runner structure along line C—C of FIG. 6. As shown in FIG. 9, contact member 24 contacts corresponding leads $22_{(17)}$ of upper IC 12 and lower IC 14. Also shown is conductive runner 48 as it passes underneath lead $22_{(17)}$ and distanced from contact with contact member 24 at this site.

Figure 10:
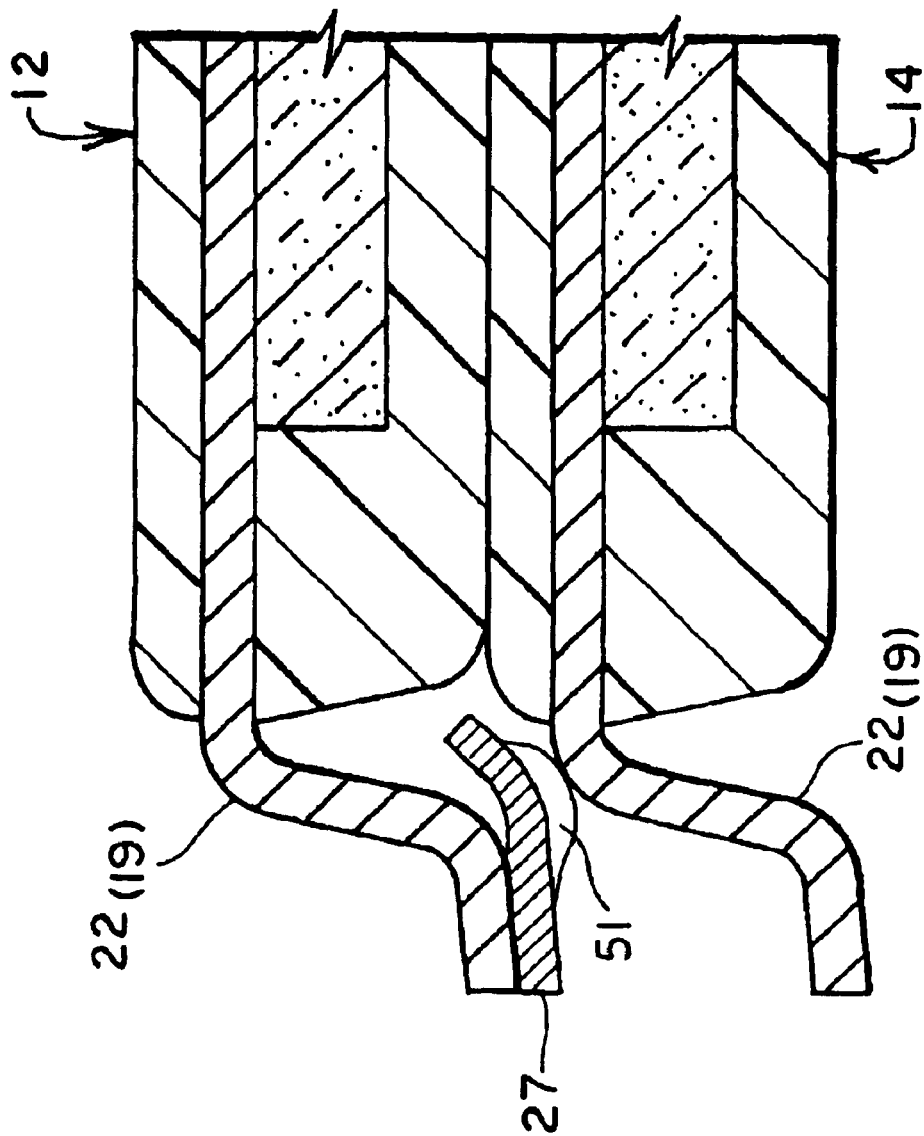
FIG. 10 depicts a sectional view of the contact member and conductive runner structure along line B—B of FIG. 6.

FIG. 10 depicts a sectional view of the contact member and conductive runner structure along line B—B of FIG. 6. As shown in FIG. 10, modified contact member 27 is shown in contact with lead $22_{(19)}$ of upper IC 12. The signal applied to modified contact 25 shown in FIG. 8 has been conveyed along conductive runner 48 that merges with modified contact member 27 in the vicinity of lead $22_{(19)}$. In a preferred embodiment, modified contact member 27 is distanced from lead $22_{(19)}$ of lower IC 14 by insulative material 51 although in alternative constructions, other methods of avoiding contact are available such as simple distance. Lead $22_{(19)}$ is the chip-enable position on a TSOP in a preferred embodiment. Consequently, the chip-enable signal intended for enablement of upper IC 12 has been applied to foot 30 of lead $22_{(15)}$ of lower IC 14 and conveyed along conductive runner 48 to modified contact member 27 which conveys the enable signal to the chip-enable lead of upper IC 12.

The provision of the contact member structures provides structural and fabrication advantages not found in previous structures. For example, such a method and structure exploits the existing lead assemblage of the constituent ICs to craft a module defining cage or framework. Although the leads are provided by the TSOP manufacturer to enable surface mounting (SMT) of the TSOP, employment of contact member structures 24 of the present invention provides advantages to the lead assemblage, namely, a low capacitance conductive pathway that allows superior thermal performance and simple stack construction and interconnectivity with structural integrity and appropriate height.

Figure 11:
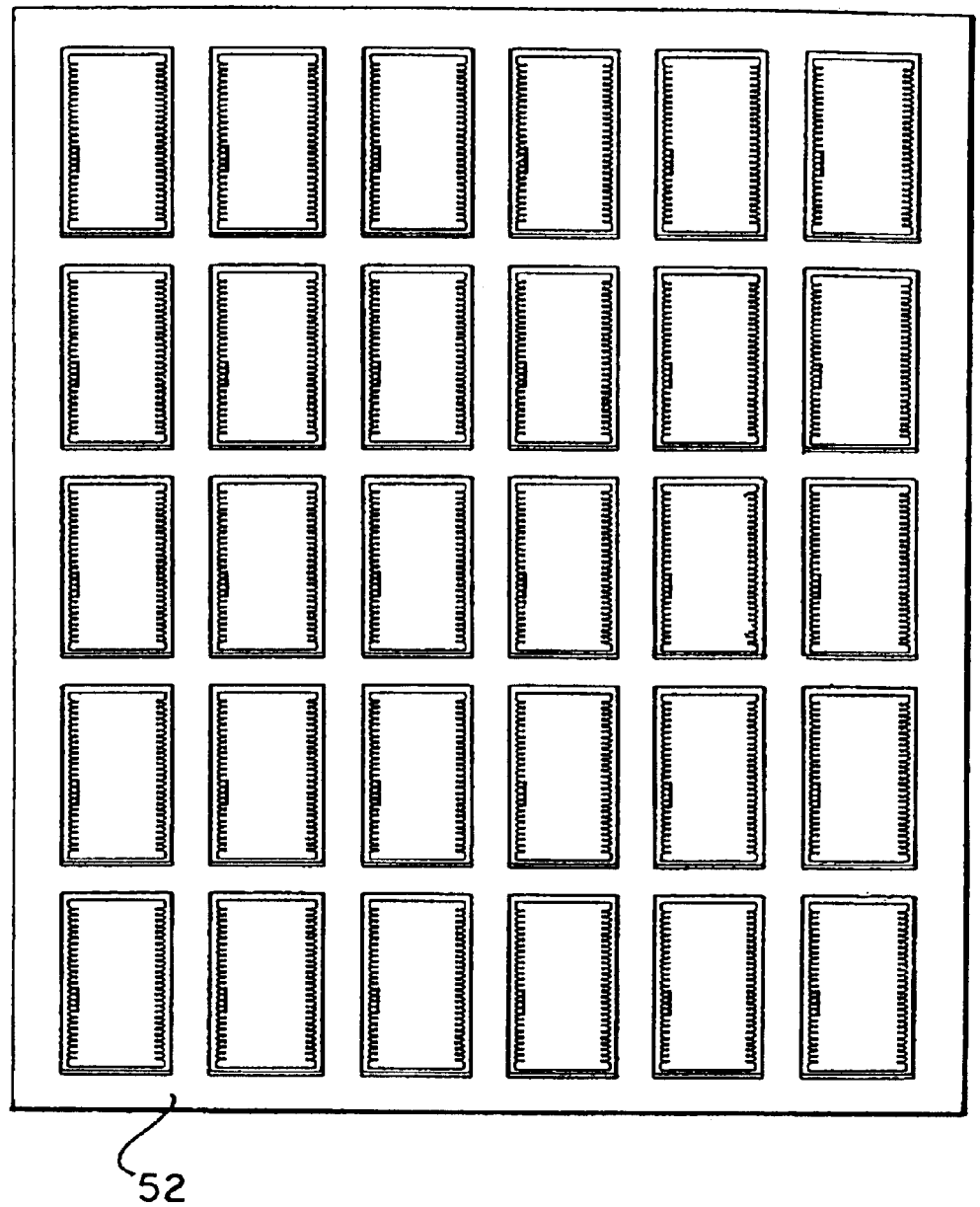
FIG. 11 depicts a carrier frame bed employed by a preferred embodiment of the present invention.
Figure 12:
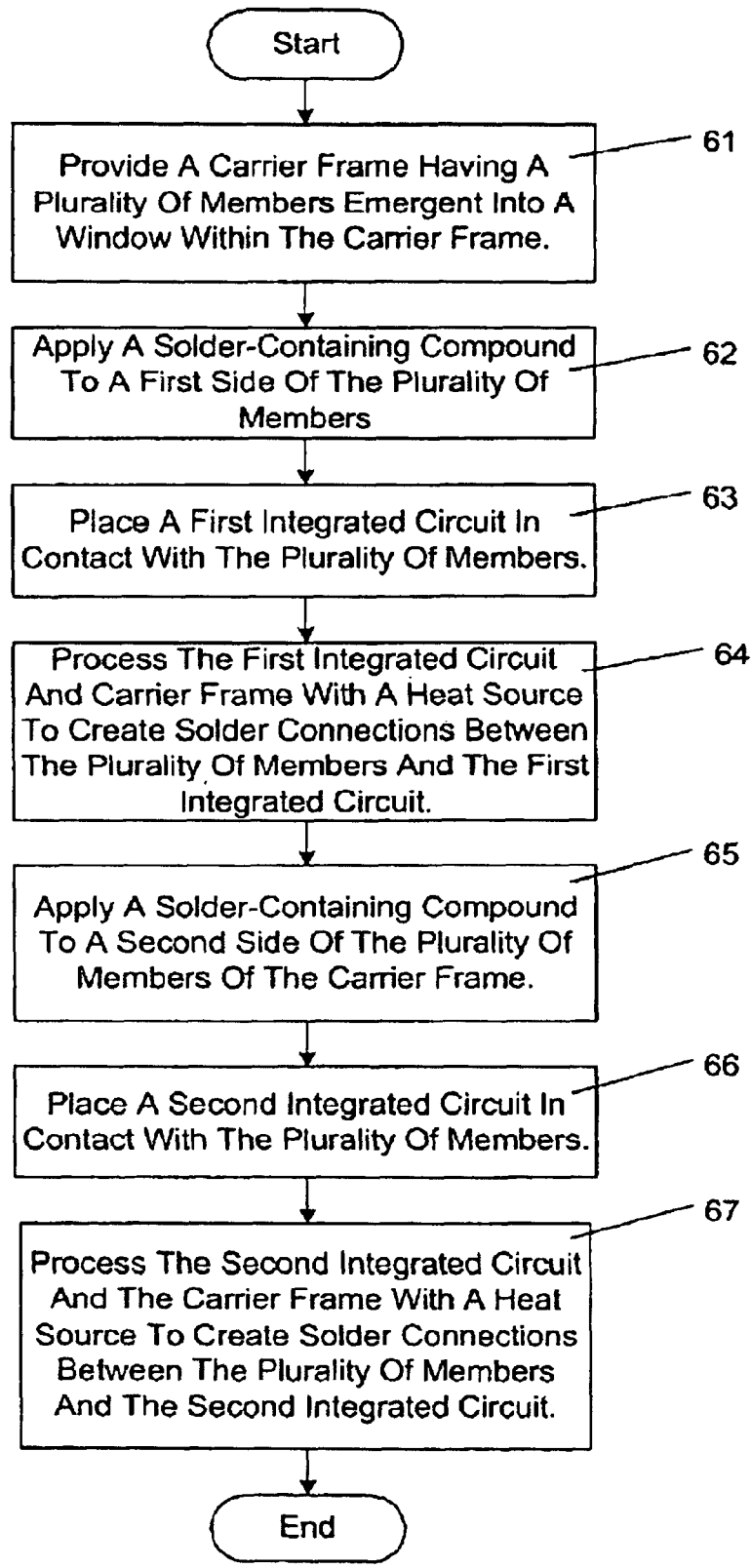
FIG. 12 shows a flow diagram with steps 61–67 for creating an integrated circuit stack according to one embodiment of the present invention.

FIG. 11 illustrates a lead frame-material carrier panel 52 consisting of multiple carrier frame areas 42. In one method of a preferred embodiment of the invention, solder paste, a combination of solder and flux, is applied to one side of the carrier panel 52. The solder paste is applied to the members of the carrier panel that will become the contact members 24. Once the solder paste has been applied, upper IC 12 is positioned with its feet 30 in contact with the solder paste. As those of skill will recognize, although many techniques are available for that placement, a common surface mount pick & place tool is suitable. The assembly is then processed through a reflow oven to create solder joints at the contact areas.

The resulting assembly is inverted and solder paste applied to the lower surface of carrier panel 52. Solder paste is not applied to areas where no joint is intended. For example, on the lower side of the carrier frame area 42 feature that will, in the finished preferred embodiment, become modified contact member 27 through which the chip select signal is applied to upper IC 12 at lead 22(19), no solder paste is applied. Lower ICs 14 are placed onto the lower side of the carrier panel 52 so that the shoulder of IC leads 22 are in contact with the solder paste applied to contact members. The assembly is then processed again through a reflow oven. Alternatively, the lower side may be processed first followed by the upper side assembly process.

In an alternative method, a holding fixture is incorporated to hold and locate the ICs for either side. Solder paste is then applied to both sides of carrier panel 52 which is subsequently placed into the fixture with the leads of the ICs in the fixture contacting one side of the carrier panel 52. The other side of the carrier panel is then populated with pick & place techniques. The entire assembly is then processed through a reflow oven creating solder connections on both upper and lower sides with one pass.

The resulting assembly is an array of stacked devices inter-connected by the lead frame carrier. Individual modules 10 are then singulated from the carrier panel or frame at the place where the ends of leads 22 of upper ICs 12 meet the lead frame carrier area 42. This can be accomplished by any of several known methods including but not limited to mechanical punch, abrasive saw, milling, laser cutting, and mechanical fatigue.

Although the present invention has been described in detail, it will be apparent to those skilled in the art that the invention may be embodied in a variety of specific forms and that various changes, substitutions and alterations can be made without departing from the spirit and scope of the invention. The described embodiments are only illustrative and not restrictive and the scope of the invention is, therefore, indicated by the following claims.

What is claimed is:

1. A method of creating a stack of integrated circuits selectively connected to provide increased memory density in an application, the method comprising the steps of:

providing a carrier frame configured to have a plurality of members emergent into a window within the carrier frame;

applying a first portion of a solder-containing compound to the first side of the plurality of members;

after applying said first portion of solder-containing compound, placing a first packaged integrated circuit in contact with the plurality of members;

processing the first integrated circuit and the carrier frame with a heat source to create a first set of solder connections between the plurality of members and the first packaged integrated circuit;

after said processing step, applying a second portion of a solder-containing compound to the second side of the plurality of members of the carrier frame;

after applying the second portion of solder-containing compound, placing a second packaged integrated circuit in contact with the plurality of members; and processing the second integrated circuit and the carrier frame with a heat source to create a second set of solder connections between the plurality of members and the second integrated circuit.

2. The method of claim 1 in which the carrier frame is provided from a carrier bed having a plurality of carrier frames.

3. The method of claim 1 in which the carrier frame and the first and second integrated circuits are further processed by separation of the plurality of members from the carrier frame.

* * * * *